(12) United States Patent
Maitland et al.

(10) Patent No.: US 7,363,574 B1
(45) Date of Patent: Apr. 22, 2008

(54) METHOD AND SYSTEM FOR PARALLEL CRC CALCULATION

(75) Inventors: Roger Maitland, Woodlawn (CA); Mark Turnbull, Stittsville (CA)

(73) Assignee: Nortel Networks Limited, St. Laurent, Quebec (CA)

( * ) Notice: Subject to any disclaimer, the term of this patent is extended or adjusted under 35 U.S.C. 154(b) by 560 days.

(21) Appl. No.: 10/961,111

(22) Filed: Oct. 12, 2004

(51) Int. Cl.
 *H03M 13/00* (2006.01)
(52) U.S. Cl. ..................................... 714/759
(58) Field of Classification Search ........... 714/759, 714/781
 See application file for complete search history.

(56) References Cited

U.S. PATENT DOCUMENTS

| | | | | |
|---|---|---|---|---|
| 6,223,320 | B1 | 4/2001 | Dubey et al. | 714/757 |
| 2002/0085586 | A1* | 7/2002 | Tzeng | 370/475 |
| 2003/0093752 | A1* | 5/2003 | Chen | 714/781 |
| 2003/0212830 | A1* | 11/2003 | Greenblat et al. | 709/251 |
| 2004/0054955 | A1* | 3/2004 | Riley | 714/781 |
| 2005/0036488 | A1* | 2/2005 | Kalkunte et al. | 370/389 |
| 2005/0182915 | A1* | 8/2005 | Devaney et al. | 712/10 |
| 2005/0283711 | A1* | 12/2005 | Claseman | 714/759 |

OTHER PUBLICATIONS http://www.simdtech.org/altivec SIMD tech; AltiVec Technology, copyright © 2003 SIMD.
http://www.freescale.com/webapp/sps/site/overview.jsp?nodeId=018rH3bTdGmKqW5Nf2 freescale semiconductor; ALTIVEC™, Oct. 6, 2004, p. 1-3.
Freescale Semiconductor, Inc.; Isn't it Time You Got Faster, Quicker?. AltiVec™ Technology At-a-Glance.
Joshi, Sanjay M., et al.; A New Parallel Algorithm for CRC Generation; IEEE, 2000, pp. 1764-1768.
Williams, Ross N.; A Painless Guide to CRC Error Detection Algorithms, Rocksoft™ Pty Ltd., Aug. 19, 1993.

* cited by examiner

*Primary Examiner*—Shelly Chase
*Assistant Examiner*—Sam Rizk

(57) ABSTRACT

A system and method for a parallel CRC calculation is provided. A set of parallel inputs are loaded into a control register, and this control register is then used with a parallel table look-up operation to look up CRC entries for each of the inputs using a single instruction. This is repeated until each input has been processed completely to produce a complete CRC. The parallel table look-up operation may be executed using the PowerPC Altivec vperm instruction.

27 Claims, 6 Drawing Sheets

| CRC TABLE LOW | CRC TABLE HIGH |
|---|---|
| 0x00 | 0x00 |
| 0x05 | 0x80 |
| 0x0F | 0x80 |
| 0x0A | 0x00 |
| 0x1B | 0x80 |
| 0x1E | 0x00 |
| 0x14 | 0x00 |
| 0x11 | 0x80 |
| 0x33 | 0x80 |
| 0x36 | 0x00 |
| 0x3C | 0x00 |
| 0x39 | 0x80 |
| 0x28 | 0x00 |
| 0x2D | 0x80 |
| 0x27 | 0x80 |
| 0x22 | 0x00 |

METHOD AND SYSTEM FOR PARALLEL CRC CALCULATION

FIELD OF THE INVENTION

The invention relates to methods and circuits for CRC (cyclic redundancy check) calculation.

BACKGROUND OF THE INVENTION

CRC calculations are a fundamental part of data transfer in almost all networks, such as the Internet or wireless networks. CRC calculation represents a significant amount of the work required to process all types of data communications. The basic idea of CRC algorithms is simply to treat a message as an enormous binary number, to divide it by another fixed binary number, and to make the remainder from this division the checksum. The checksum is transmitted along with the message. Upon receipt of the message, a receiver can perform the same division and compare the remainder with the checksum. If the computed remainder is the same, then the conclusion is made that the message was properly received.

The division employed in CRC algorithms is not conventional division. Rather it is division derived from binary arithmetic without carries in which addition and subtraction are equivalent and are each equivalent to the XOR operation. A division operation is defined that is consistent with these definitions for addition and subtraction, and will be referred to herein as "CRC division".

CRC calculation involves the selection of a "polynomial" of length W+1 upon which to base the calculation, where W is the width of the polynomial. This is divided using CRC division into the original message augmented by M−1 "0" bits, the so-called augmented message. To implement CRC division, the message is fed through a division register. In all the following examples the message will be considered to be a stream of bytes (each of 8 bits) with bit 7 of each byte being considered to be the most significant bit (MSB). The bit stream formed from these bytes will be the bit stream with the MSB (bit 7) of the first byte first, going down to bit 0 of the first byte; and then the MSB of the second byte and so on.

With this in mind, an implementation of the CRC division can be sketched. For the purposes of example, consider a polynomial with W=4 and the poly=10111. Then, to perform the division, a 4-bit register is used:

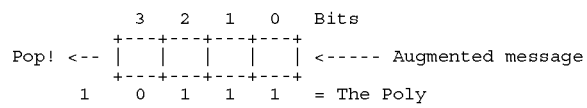

To perform the division perform the following:
Load the register with zero bits.
Augment the message by appending W zero bits to the end of it.
While (more message bits)
Begin
Shift the register left by one bit, reading the next bit of the augmented message into register bit position 0.
If (a 1 bit popped out of the register during the shifting step)
Register=Register XOR Poly.
End The register now contains the remainder. In practice, the IF condition can be tested by testing the top bit of the register before performing the shift.

Because this simple algorithm operates at the bit level, it is rather awkward to code, and inefficient to execute (it has to loop once for each bit), although H/W implementations often use this method. To speed calculations up, algorithms that process the message a byte at a time are commonly used where most of the calculation is pre-computed and assembled into a table. The above algorithm can be reduced to the following where a 32 bit polynomial is assumed, and where a pre-computed table having 256 32-bit values is employed:

While (augmented message is not exhausted)
Begin
   Top=top_byte(Register); {extract top byte in the register as the index into the pre-computed table}
   Register=(Register<<24)|next_augmessage_byte;
   {shift the register left by one byte, reading in a new message byte}
   Register=Register XOR precomputed_table[Top];
End Further details of standard CRC processing can be taken from "A PAINLESS GUIDE TO CRC ERROR DETECTION ALGORITHMS" by Ross N. Williams hereby incorporated by reference in its entirety, and "A Tutorial on CRC Computations" published in 1988 in IEEE Micro.

SUMMARY OF THE INVENTION

According to one broad aspect, the invention provides a method comprising: initializing a control vector with content from each of a plurality of inputs; a) performing a parallel table look-up using the control vector to produce a table look-up output vector containing an element for each of the plurality of inputs by looking up table entries for CRC calculation in parallel; b) merging each element of the control vector with new bits from each of the inputs to produce a combined cumulative results and current input vector; c) combining with a vector XOR operation the table look-up output vector and the combined cumulative results and current input vector and storing a result as a new value for the control vector; repeating a), b) and c) until a CRC calculation is complete for all inputs.

In some embodiments, the method further comprises: storing the table entries in at least one register and storing the control vector in a register such that the parallel table look-up operation proceeds with register inputs.

In some embodiments, the method further comprises: storing the table entries in a first and second register, the first register containing low bits for each table entry and the second register containing high bits for each table entry; for each element of the control vector, performing the table look-up by looking up a value in each of the first and second registers and combining these to produce a table look-up output vector.

In some embodiments, the method further comprises: repeating the steps of table look-up and XOR a plurality of times each time the control vector is updated.

In some embodiments, loading the control vector comprises: performing a plurality of vector permutation operations in sequence, each vector permutation taking content from a respective one of the inputs into a high position in the vector permutation output, and shifting previously stored values in the vector permutation output.

In some embodiments, the method further comprises: for each input that has a start that is not aligned in memory with a start of an earliest input, processing zeros for the input such that the parallel CRC calculation can start at the same time for all inputs.

In some embodiments, the method further comprises: for each input that has an end that is not aligned in memory with an end of a latest input, storing a finished CRC output upon completion of processing of the actual input, and then continuing to perform the algorithm in parallel for all inputs until all CRC calculations are complete, but ignoring the output produced after CRC completion for a given input.

In some embodiments, a 16-way parallel CRC16 calculation is performed.

In some embodiments, the control vector is a 16 element HiByte vector and a 16-element LoByte vector each having 8 bits per element; the table data comprises two tables each containing 16 8-bit values; performing the parallel table look-up, merging and combining comprises: performing a first pair of table lookups using the two tables with four bits of each element of HiByte as input; removing used four bits and shifting next four bits into lookup position to produce a first combined cumulative results and current input vector; combining with a first XOR operation outputs of the first pair of table lookups with the first combined cumulative results and current input vector; performing a second pair of table lookups using four bits of output of first XOR operation; removing used four bits and shifting next four bits into lookup position to produce a second combined cumulative results and current input vector; combining with a second XOR operation outputs of the second pair of table lookups with the second combined cumulative results and current input vector; obtaining next set of 8 bits from each input and combining with an output of the second XOR operation to produce the control vector for a subsequent iteration.

In some embodiments, the method further comprises: repeating steps a), b) and c) in phases for each input, each phase comprising a set of repetitions of steps a) b) and c) for each input; at the end of each phase, if CRC calculation for a given input is complete, storing a finished result for that input and otherwise using a result at the end of the phase as a starting point to the next phase.

In some embodiments, the method further comprises: making each input available to start a new CRC calculation at a start of a phase following a phase during which CRC calculation for the input was complete.

In some embodiments, the parallel table look-up is performed with a PowerPC Altivec vperm instruction.

Another broad aspect provides a computer readable medium having processor executable instructions thereon for implementation by a vector processor, the instructions providing one of the above summarized methods of performing CRC calculations.

Another broad aspect of the invention provides a CRC calculator adapted to implement one of the above summarized methods.

Another broad aspect provides a method comprising initializing a control vector with content from each of a plurality of inputs; a) performing a parallel operation to produce an output vector containing an element for each of the plurality of inputs; b) merging each element of the control vector with new bits from each of the inputs to produce a combined cumulative results and current input vector; c) combining with a vector XOR operation the output vector and the combined cumulative results and current input vector and storing a result as a new value for the control vector; repeating a), b) and c) until a CRC calculation is complete for all inputs. The parallel operation might be parallel combinatorial logic.

DETAILED DESCRIPTION OF THE PREFERRED EMBODIMENTS

A 2-input vector permutation instruction operates upon two vector inputs to produce a vector output. The first vector input is a "control vector" and the second vector input is a "table vector". The vector output is the "result vector". The control vector (array of N elements) is created that determines which table vector element will fill the corresponding position in the result vector. Consider the following example, where entries are indexed from 0 to 15:

16-element Control Vector: 4 8 3 9 1 7 5 15 2 12 11 1 13 0 14 10

16-element Table Vector: 3 5 7 9 11 13 15 1 0 2 4 6 8 10 12 14

16-element Result Vector: 11 0 9 2 5 1 13 14 7 8 6 5 10 3 12 4

In the example, the first control vector entry has a value 4 in it, which implies that table vector entry 4 (11) should be placed in the first entry of the result vector. The 7th entry in the control vector has a value of 5 which implies that the 6th entry in the table (13) should be placed in the 7th entry of the result vector. With the vector permutation operation, all 16 entries in the result vector are filled in following this method in one processor clock cycle.

A 3-input vector permutation operates similarly. The only difference is that the control vector selects inputs from two different tables. For example, for an 8 bit implementation, the first nibble (i.e. the first four bits) might be a "one" or a "zero" to select between two different tables, and the second nibble will select one or 16 table entries of the selected table. An example of a vector permutation hardware instruction is the vperm instruction of the Power PC Altivec Processor. Other processors may offer their own instructions.

Figure 1:
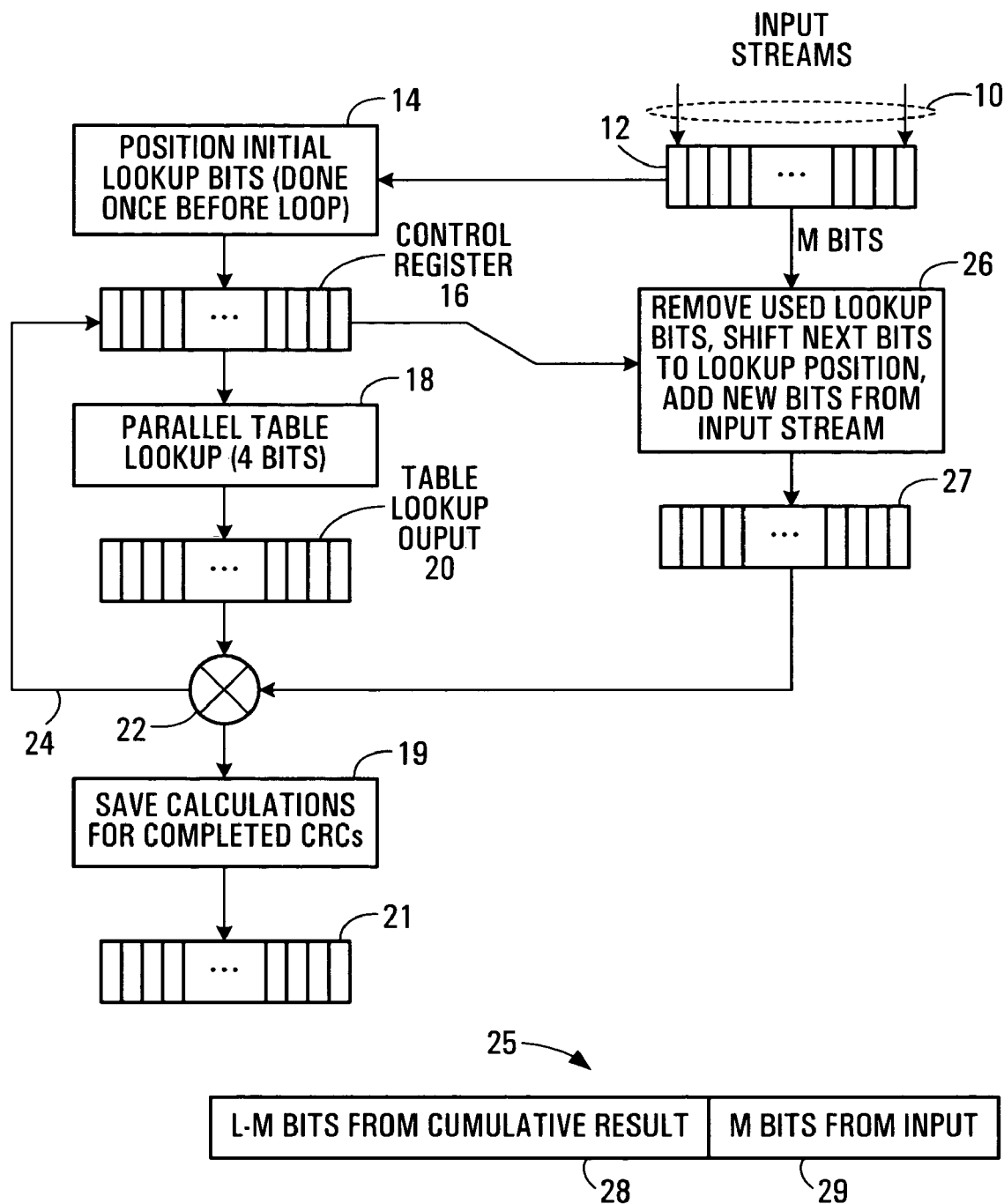
FIG. 1 is a block diagram of a first parallel CRC calculator provided by an embodiment of the invention.

Referring now to FIG. 1, shown is a block diagram of a parallel CRC calculator provided by an embodiment of the invention. The CRC calculator has N inputs 10 through which the bit streams upon which the CRC calculations are to be performed are received. The actual value of N will depend upon the degree of parallelism desired, and upon hardware limitations of the circuits used to build the CRC calculator. The N inputs 10 are fed into registers 12, with one register 12 for each of the N inputs 10. The registers 12 are used to hold at least part of each input during CRC calculation. The registers 12 may not necessarily be large enough to contain the entire bit stream upon which a CRC calculation is to be performed. In this case, partial calculations are performed on part of the input stored in the registers 12, and then the registers are updated with additional content from the inputs, and further calculations performed. The intermediate step of storing the input into the registers 12 may be skipped if the input streams are directly accessible.

Also shown is an N-element control register 16. L bits from each input are stored at 14 as an N-element control vector in the elements of the control register 16. L is the length of the CRC operation. For example, for a CRC16 calculation, L=16. The CRC calculations will precede M bits at a time. M is a design parameter that determines the size of look-up table. Only the first time through are bits from each input fed directly into the control register 16 as shown, these being the "initial look-up bits". The N-element control vector is then used to perform a parallel table look-up operation 18 to generate an N-element table look-up output vector 20. The table data used for the parallel table look-up contains $2^M$ entries, each entry being L bits in length. If L is greater than the size of a single element of a vector register processable by a given platform, then the table can be split into multiple tables each containing $L_1, \ldots L_K$ bits per table entry, such that $L_1 + \ldots + L_K = L$. It can be seen that the selection of M will determine the number of entries in the table. Preferably, the entire table data is stored in a register or a small number of registers. Each element of the N-element control vector looks up a respective table entry in the table data, with a total of N table look-ups being performed in parallel. The output vector 20 consists of L bits for each of the N-elements. The actual table data is a function of the particular CRC implementation. The table data will be the same as would be used for a simple non-parallel implementation, and the method of determining the table data entries is well understood, and will not be elaborated upon further here.

An N-element cumulative results is indicated at 24 and this is fed back to the control vector 16. Thus, the control vector and the cumulative results vector become synonymous. This starts at zero at the initialization of the CRC calculation. The N-element cumulative results 24 is processed at 26 to produce a combined cumulative results and current input vector 27 which is fed to a vector XOR operation 22. The vector XOR operation 22 receives the N-element table look-up output vector 20 and the combined cumulative results and current input 27 produced by function 26.

The cumulative results and the current input are combined at 26 by removing the used look-up bits, shifting the next bits into the look-up position, and adding new bits from the input. However, the desired effect is that for each of the N inputs, the M bits from the input are combined with L-M bits of the previous N-element control vector. An example of the output 27 produced by the combined cumulative results and current input function 26 is indicated at 25 for a single one of the channels. Shown are L-M bits 28 from the cumulative results and M bits 29 taken from the input. There are a number of methods of generating inputs 27 using the current cumulative results and the inputs. A particular parallel implementation will be described below, but it is to be understood other parallel implementations may alternatively be employed.

Also shown is a finished CRC output 21. When the computation of the CRC for a given input is complete, the output of XOR operation 22 is copied into the finished CRC output at 19.

In operation, the registers 12 are initially loaded with content from the N inputs. M bits from each input are read into the N-element control vector, and these are used to look-up N values in the table data to produce table look-up output vector 20. This is XOR'ed with the output of combined cumulative results and current input function 27, and the output is the current N-element cumulative results 24 and this becomes the new control vector 16. This is then repeated for the next M bits from each input until the content of the registers 12 is exhausted. Then, assuming there is still more of the inputs to be processed, the registers are reloaded with further content from the N inputs. The process then repeats until the inputs are exhausted. The N-element cumulative results 24 at the end of this process will contain the computed CRC for each input.

A very specific mechanism for getting the bits from the N inputs into the control register has been described. More generally, any method of taking M bits from each of the N inputs to generate the vector 16 can be employed.

Figure 2:
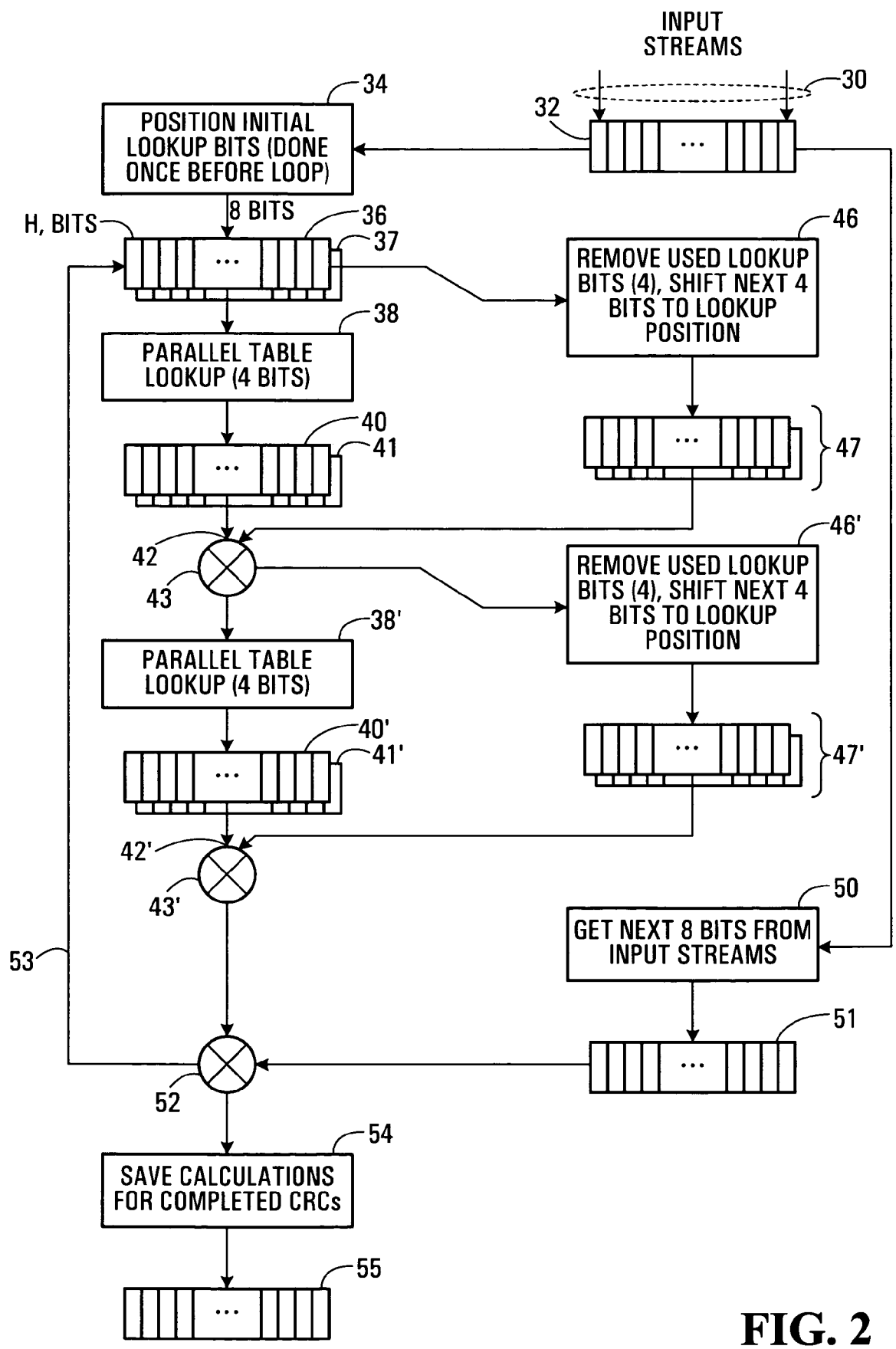
FIG. 2 is a block diagram of another parallel CRC calculator provided by an embodiment of the invention.

Referring now to FIG. 2, shown is a specific example implementation of a CRC calculation circuit provided by an embodiment of the invention. With this particular example, it is assumed 16 inputs are to have their CRC16 calculated in parallel. 16 inputs are indicated at 30, and these are fed into registers 32. If the input streams are directly accessible, this step can be skipped. With this particular implementation, with operation 34 the first eight bits of each of the registers 32 are fed into the 16-element HiByte control register 36. The second 8 bits from each input are stored in a 16-element LoByte control register 37.

For this example, 4-bit table look-ups are performed meaning that each time 8 bits are obtained from the input, there are enough bits for two 4-bit table look-up operations 38 and 38'. For a CRC16 calculation, each table look-up operation must produce L=16 bits for each of 16 possible 4-bit inputs. For implementations in which 16 bit vector elements are not possible, the table will need to be split. For example, a first table with $L_1=8$ bits and a second table with $L_2=8$ bits can be used. These will be referred to as a table low register and a table high register. The same four look-up bits are used to obtain 8 bits from each of the tables. During look-up operation 38 the first four bits of each element of the 16-element of the HiByte control vector are used to look-up an entry from the table low register and the table high register to produce 16 bits total for each element. This is done in parallel such that an output 40 is produced in the form of a vector having 16 8-bit entries, one for each of the input channels and an output 41 is produced in the form of a vector having 16 8-bit entries, one for each channel. Logically, the two outputs 40, 41 can be thought of as a single table look-up output 42 of 16 elements each containing 16 bits. Similarly, the HiByte control vector 36 and the LoByte control vector 37 can logically be thought of as a single 16 element control vector. The table look-up output vector 42 is then vector XOR'ed at 43 with vector 47 which was produced at 46 by removing 4 used look-up bits and shifting the next 4 bits to the look-up position. XOR operation 43 and the other XORs referred to below represents a HiByte operation and a LoByte operation. The process is then repeated using the 4 bits now in the look-up position. Steps 38', 43', 46' are the same as steps 38, 43, 46 described above, and results 40', 41', 42', 47' are analogous to results 40, 41, 42, 47 described above. Thus, it takes two passes through the parallel table look-up to process 8 bits of the input. More generally, depending upon the number of bits loaded into each control element, it will take one or more passes to process the contents of the control vector using the parallel table look-ups. Next, 8 new bits from the input streams are obtained at 50 and loaded into vector 51.

This is then XOR'ed at 52 into the low byte output of operation 43' and the results are fed back at 53 to the HiByte control vector 36 and the LoByte control vector 37. Also, calculations are saved for completed CRCs at 54 in finished CRC register 55.

Figures 4, 5:
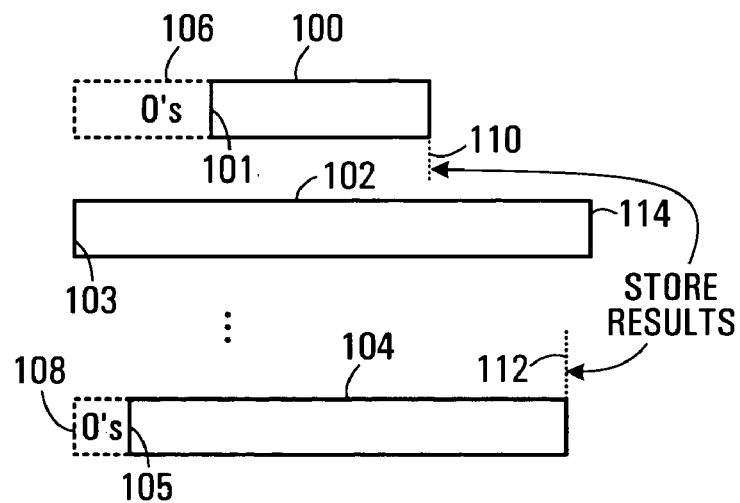
FIG. 4 is a packet timing diagram for use in illustrating how packets of varying lengths and memory alignments can be processed using the parallel CRC algorithms provided by embodiments of the invention.
FIG. 5 is an example of a CRC table contents.

FIG. 5 shows an example of values for the CRC table low and for the table high vector for a CRC16 calculation. It is noted that these values were selected for a particular CRC polynomial of $D^{16}+D^{15}+D^{2}+1$.

Figure 3:
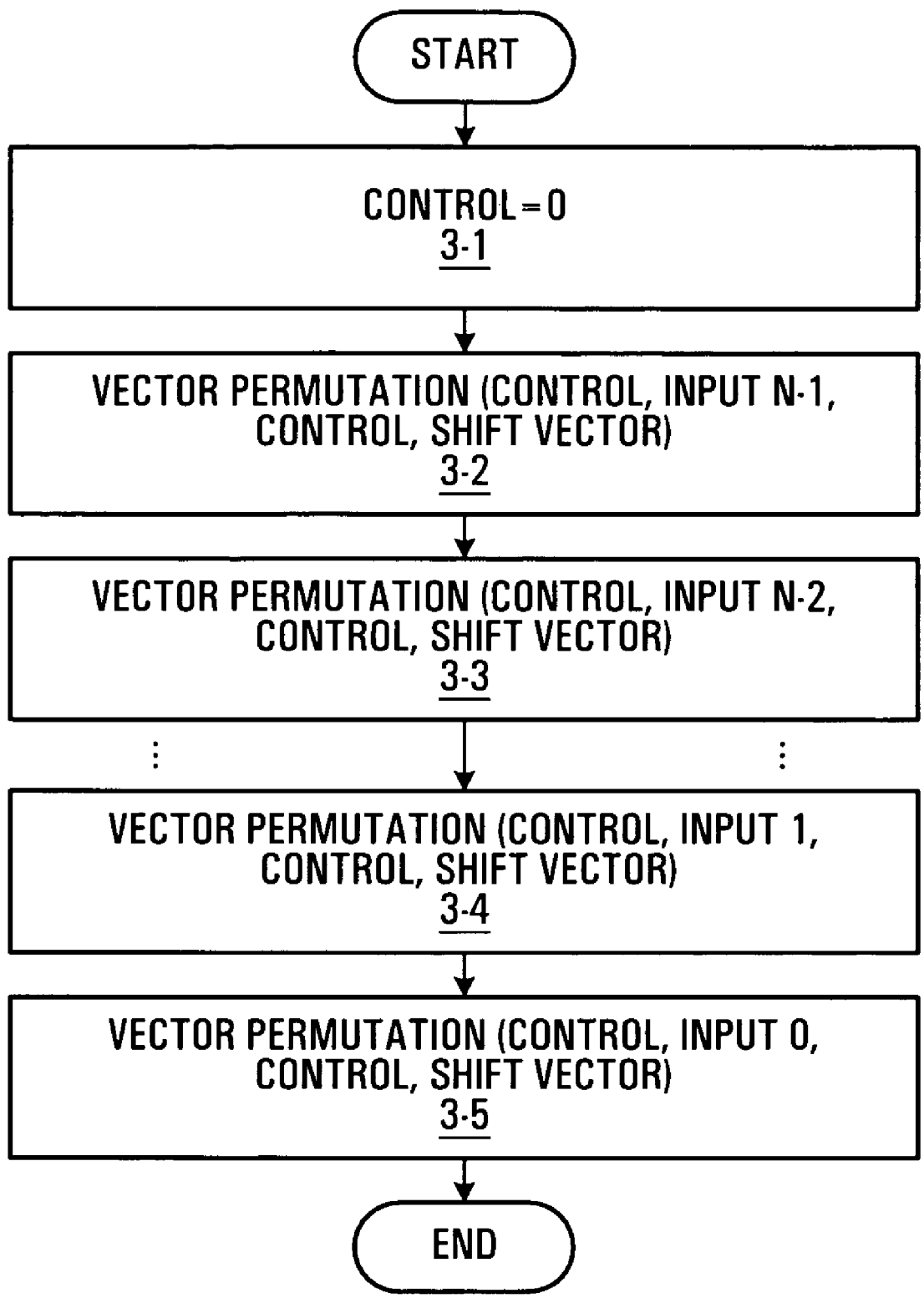
FIG. 3 is a flowchart of a method of loading the control vector for use in the CRC calculators of FIGS. 1 and 2.

Referring now to FIG. 3, shown is a preferred method of loading the control register 46 from the input registers that can be performed both for the LoByte and HiByte control registers. It is to be understood that this is only one method that could be employed and that other methods may alternatively be used. The method starts with the N-element control register being set to zero at step 3-1. Next, a vector permutation operation is performed that takes two input vectors, one being the N–$1^{st}$ input, and the other being a previous value of the control vector. The operation is: vector permutation (control, input n–1, control, shift vector) The vector permutation control vector for this operation is the "shift vector" which is pre-selected to perform a particular operation on the input vector and the previous control vector to produce a new value for the control vector. In particular, this selects the desired byte from the selected input for the first element of the control output, and shifts all previous elements of the control vector by one byte. By repeating this operation at step 3-3 through 3-5 for each of the N inputs, the content of the control vector initially contains one byte from the N–$1^{st}$ input, after the second iteration will contain a byte from the N–$2^{nd}$ input followed by a byte from N–$1^{st}$ input and so on until at completion of the algorithm the vector will contain a byte from the $0^{th}$ input followed by the first input through to the N–$1^{st}$ input. Specifically, the operation in step 3-3 for the N–$2^{nd}$ input is:

vector permutation (control, input n–2, control, shift vector)

This is followed by similar steps, not shown, for inputs n–3, . . . , 2. The operation in step 3-4 for the input 1 is:

vector permutation (control, input 1, control, shift vector)

The operation in step 3-3 for the input 0 is:

vector permutation (control, input 0, control, shift vector)

In a preferred embodiment, the CRC calculator of FIG. 1 is adapted to handle inputs that may have varying lengths, and that may not necessarily be aligned in memory. An example of this is shown in FIG. 4 where three inputs 100, 102, 104 are shown and having various start points 101, 103, 105 that are not aligned in memory. For example, a read to memory that is 4 byte aligned will return content starting at a 4 byte boundary 0, 4, 8, 12, etc. If the CRC is to start using data in position 3, for example, this is said to be "not aligned". In order that the parallel calculation proceed, preferably the processing proceeds using zeros at the start of each message that starts later than the earliest message. Thus, in the illustrated example, zeroes 106 are processed at the start of input 100, and zeroes 108 are processed at the start of input 105 such that all of the inputs can be started simultaneously with an aligned start point. The processing of zeroes at the start of an input sequence will not effect the CRC calculation. Furthermore, at the end of the CRC calculation for a given input that is shorter than the longest input, the result is preferably stored in a location other than the N-element cumulative results. This means that the parallel computation can proceed on all N inputs until the longest input has been processed, but that the proper result will have been taken at the right time for each of the N inputs. For example, for input 100, the result will be stored at 110, and for input 104, the result will be stored at 112. The remainder of the parallel CRC computation however proceeds identically to that preceding the store of these final results. Of course, the most efficiency gains are achieved when the inputs ate similar in length, and are similarly aligned in memory.

The issue with memory alignment is hardware specific. For example when using the PowerPC vectors, the alignment boundary is sixteen bytes. This means that when looking at FIG. 6 for a PowerPC implementation, 0 to 15 zeros are processed before the real CRC starts on any particular input.

Note that for the purpose of the input streams being processed, the so-called augmented data input is employed. As is well understood for CRC calculations, the actual input data stream is augmented to include additional "0" bits to allow for the length of the CRC. The first time a CRC is calculated, these bits would be set to zero. When computing a CRC on a received bit stream, typically these additional bits will be the received CRC. When a CRC is computed on a received bit stream consisting of the data followed by the CRC, the "right answer" for the overall CRC calculation is zero.

Figure 6:
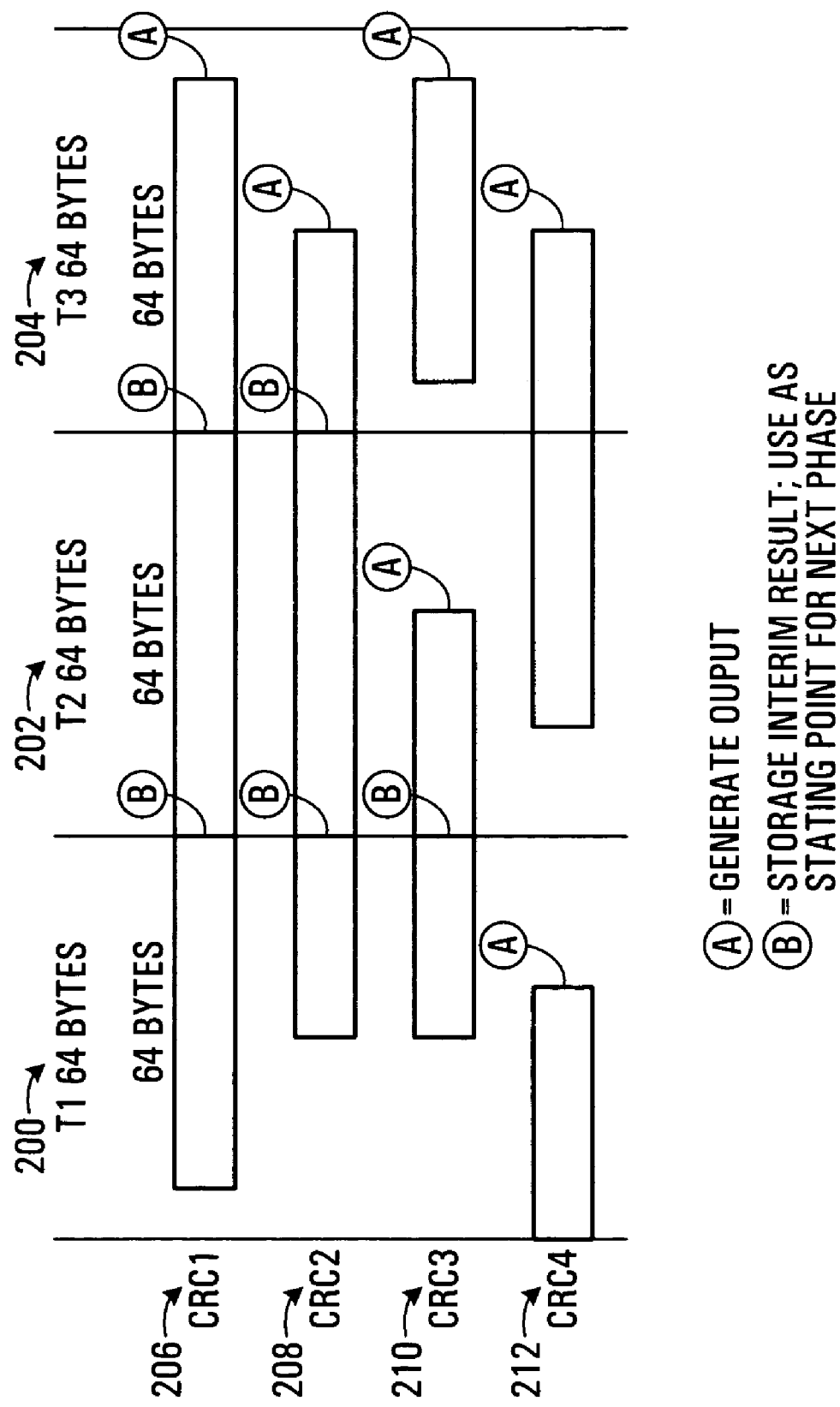
FIG. 6 is a packet timing diagram illustrating how the parallel CRC engines can be employed to perform CRC calculations on inputs having very different lengths.

In another embodiment of the invention, the CRC calculation is implemented in phases. More specifically, during a given CRC phase a complete CRC calculation is performed on vector inputs or portions of vector inputs up to some certain maximum length. For inputs that are less than this maximum length, the complete CRC can be computed during one CRC calculation phase. For inputs that are greater than this maximum length, an interim result is stored at the end of the CRC calculation phase, and this is used as the input to the next CRC calculation phase. In this manner, the parallel CRC calculation methods and circuits can be applied to input data streams that are of vastly differing lengths, without a significant decrease in the efficiency of the parallel method. An example of this is shown in FIG. 6. Here, the CRC parallel CRC calculation is divided into phases of 64 bytes duration each with three phases of a continuous stream of phases shown. A first phase T1 200, a second phase T2 202 and a third phase T3 204 are shown each 64 bytes in length. More generally, any appropriate length may be employed. At the end of each CRC phase, either an output has been generated for a given data stream, or an interim output is generated and stored as an input to the next CRC phase. Four example inputs are shown at 206, 208,210,212. Input 206 starts after the beginning of phase T1 200; and lasts until part way through phase T3 204. Wherever a data input crosses a boundary of between two phases, an interim result is stored and this is used as a starting point for the next phase. For the first input 206, this occurs twice. For the second example input 208, this is similar to the first example and an interim result is stored and used as an input to the next CRC phase on two occasions. In the third example 210, the data stream starts part way through the first phase T1 200 and ends in the second phase 202. Thus, the interim result is stored at the end of the first phase, and an output is generated during the second phase. For the same input in the parallel inputs, a second later input is shown starting in the next phase, namely T3 204. This ends within that phase and an output is generated. Finally, the fourth input 212 is shown to begin at the start of the first phase T1 200 and to end during that phase. A second later input is started during the second phase T2 202 and completed during the third phase T3 204. Thus an output is generated during that phase and that CRC engine is then available for another CRC calculation any time during the second phase.

It can be seen that by dividing up the CRC calculations in this way, the parallel CRC calculator can be used more efficiently. Rather than waiting until the completion of the CRC for the longest input (input 206 of FIG. 1 for example) before re-initializing the entire parallel CRC calculator, each input can be re-started independently for each CRC phase as that input becomes available.

Preferably the techniques introduced earlier for allowing input streams that are not aligned in memory are also employed here such that input streams that are not aligned with the phase boundaries can also be accommodated. Similarly, while the outputs are taken at the end of each CRC calculation for the given input, the parallel CRC engine will typically continue on for the entire CRC phase. Thus the output needs to be stored at the end of the CRC calculation for the given data stream such that it is not corrupted during the further CRC calculations.

The example of FIG. 6 has been a very specific example in which CRC calculation phases are 64 bytes in length. More generally, any suitable length can be employed. A shorter length will allow increased utilization of the parallel CRC engine, but may result in further overhead in initializing the engine between phases.

Figure 7:
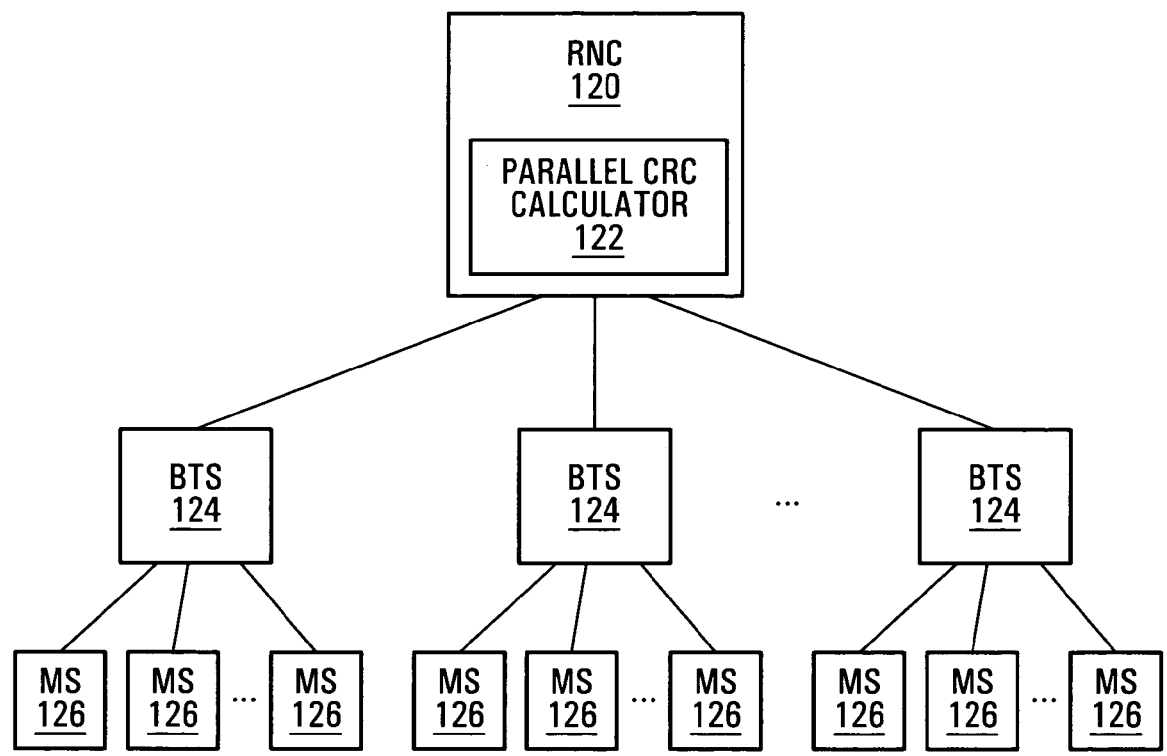
FIG. 7 is a block diagram of an example network within which the parallel CRC calculator can be employed.

FIG. 7 is a block diagram of a network within which the parallel CRC calculator provided by the invention may be employed. Shown is an RNC (radio network controller) 120 connected to multiple BTSs (base station transceivers) 124 (referred to as node-B's in a UMTS system). Each BTS 124 provides a wireless service to a respective group of mobile stations 126. The RNC 120 is shown to include a parallel CRC calculator 122. In such a system, CRCs are typically employed on almost all communications from the mobile stations 126 up through the network. For example, each voice sample is typically accompanied by a CRC calculation. Thus, the RNC 120 needs to be able to perform CRC calculations for a large number of data stream. Using the parallel CRC calculator 122, a large number of CRC calculations can be performed efficiently and in parallel for the multiple mobile stations.

In the embodiments described above, a parallel table look-up operation is performed in implementing the CRC calculations. More generally, the CRC calculations for each iteration can be performed using any parallel technique. For example, in one specific implementation, a parallel set of combinatorial logic is used to implement this portion of the parallel CRC calculation.

The following is a detailed example of a method that may be used to load the control vector initially. This method is particular to a 16× parallel implementation but can be applied to other implementations.

A collector vector is defined that will gather one byte from each of 16 input streams into a single vector (all number in hexadecimal):

Collector=01, 02, 03, 04, 05, 06, 07, 08, 09, 0A, 0B, 0C, 0D, 0E, 0F, 10
 It is used in the following way
 vperm inputs, inputs, input1, collector
 vperm inputs, inputs, input2, collector
 . . .
 vperm inputs, inputs, input16, collector What this collector does is take the last 15 elements of "inputs" (01-0F), and shifts them left one element. Then it takes the first element of the particular input stream(1-16), using the last element of the collector, in this case "10". After running the above 16 VPERMS, "inputs" will now have the first byte from each of the 16 input streams. Note that before this instruction sequence starts, "inputs" has 16 elements of garbage. After the first VPERM, the first 15 are garbage, and only the last has valid data. After the 2nd VPERM, there are 14 garbage and two valid data, etc.

On the next iteration of the CRC, it will be necessary to take each of the 2nd bytes from each of the input streams. This is achieved by incrementing the last (rightmost) byte of the collector, and then running the 16 VPERMs again, (and so on until all 16 bytes of each input have been consumed, or the CRC has stopped).

Thus, to increment the last byte, a vector addition is performed:

01, 02, 03, 04, 05, 06, 07, 08, 09, 0A, 0B, 0C, 0D, 0E, 0F, 10+00, 00, 00, 00, 00, 00, 00, 00, 00, 00, 00, 00, 00, 00, 00, 01=01, 02, 03, 04, 05, 06, 07, 08, 09, 0A, 0B, 0C, 0D, 0E, 0F, 11

In another implementation, some pre-processing outside the CRC loop is performed so that only 8 VPERMs are necessary inside the loop (giving a substantial performance increase). In this implementation, the 16 input vectors are pre-processed into 8 combined input vectors, containing only half of the 16 input bytes for each of the 16 input stream. For the purpose of this explanation, the first half of the input streams are "numbered" as bytes a-h. After pre-processing, 8 combined input vectors are produced as follows:

input1*a*, input2*a*, input1*b*, input2*b*, . . . input1*h*, input2*h* input3*a*, input4*a*, input3*b*, input4*b*, . . . input3*h*, input4*h*

. . .

input15*a*, input16*a*, input15*b*, input16*b*, . . . input15*h*, input16*h*

The collector is as follows:

Collector=02, 03, 04, 05, 06, 07, 08, 09, 0A, 0B, 0C, 0D, 0E, 0F, 10, 11 This collector takes two bytes at a time from the inputs. It is used in the following way (now only 8 VPERMs instead of 16):
 vperm inputs, inputs, combinedInput1, collector
 vperm inputs, inputs, combinedInput2, collector
 . . .
 vperm inputs, inputs, combinedInput8, collector Incrementing the collector vector is now:

02, 03, 04, 05, 06, 07, 08, 09, 0A, 0B, 0C, 0D, 0E, 0F, 10, 11+00, 00, 00, 00, 00, 00, 00, 00, 00, 00, 00, 00, 00, 00, 02, 02=02, 03, 04, 05, 06, 07, 08, 09, 0A, 0B, 0C, 0D, 0E, 0F, 12, 13

After 8 bytes of each input stream are CRC'ed, another pre-processing step would occur for input bytes i to p.

Numerous modifications and variations of the present invention are possible in light of the above teachings. It is therefore to be understood that within the scope of the appended claims, the invention may be practiced otherwise than as specifically described herein.

We claim:

1. A method of using a parallel processor for performing a CRC calculation for each of a plurality of inputs, the method comprising:
 initializing a control vector with content from each of the plurality of inputs;
 a) performing a parallel table look-up using the control vector to produce a table look-up output vector containing an element for each of the plurality of inputs by looking up table entries for CRC calculation in parallel;

b) merging each element of the control vector with new bits from each of the inputs to produce a combined cumulative results and current input vector;

c) combining with a vector XOR operation the table look-up output vector and the combined cumulative results and current input vector and storing a result as a new value for the control vector;

repeating a), b) and c) until a CRC calculation is complete for all inputs.

2. The method of claim 1 further comprising:
storing the table entries in at least one register and storing the control vector in a register such that the parallel table look-up operation proceeds with register inputs.

3. The method of claim 1 further comprising:
storing the table entries in a first and second register, the first register containing low bits for each table entry and the second register containing high bits for each table entry;
for each element of the control vector, performing the table look-up by looking up a value in each of the first and second registers and combining these to produce a table look-up output vector.

4. The method of claim 1 further comprising:
repeating the steps of table look-up and XOR a plurality of times each time the control vector is updated.

5. The method of claim 1 wherein initializing the control vector comprises:
performing a plurality of vector permutation operations in sequence, each vector permutation taking content from a respective one of the inputs into a high position in the vector permutation output, and shifting previously stored values in the vector permutation output.

6. The method of claim 1 further comprising:
for each input that has a start that is not aligned in memory with a start of an earliest input, processing zeros for the input such that performing the CRC calculation in parallel can start at the same time for all inputs.

7. The method of claim 1 further comprising:
for each input that has an end that is not aligned in memory with an end of a latest input, storing a finished CRC output upon completion of processing of the actual input, and then continuing to perform the algorithm in parallel for all inputs until all CRC calculations are complete, but ignoring the output produced after CRC completion for a given input.

8. The method of claim 1 wherein a 16-way parallel CRC16 calculation is performed.

9. The method or claim 8 wherein:
the control vector is a 16 element HiByte vector and a 16-element LoByte vector each having 8 bits per element;
the table data comprises two tables each containing 16 8-bit values;
performing the parallel table look-up, merging and combining comprises:
performing a first pair of table lookups using the two tables with four bits of each element of HiByte as input;
removing used four bits and shifting next four bits into lookup position to produce a first combined cumulative results and current input vector;
combining with a first XOR operation outputs of the first pair of table lookups with the first combined cumulative results and current input vector;
performing a second pair of table lookups using four bits of output of first XOR operation;
removing used four bits and shifting next four bits into lookup position to produce a second combined cumulative results and current input vector;
combining with a second XOR operation outputs of the second pair of table lookups with the second combined cumulative results and current input vector;
obtaining next set of 8 bits from each input and combining with an output of the second XOR operation to produce the control vector for a subsequent iteration.

10. The method of claim 1 further comprising:
repeating steps a), b) and c) in phases for each input, each phase comprising a set of repetitions of steps a) b) and c) for each input;
at the end of each phase, if performing the CRC calculation for a given input is complete, storing a finished result for that input and otherwise using a result at the end of the phase as a starting point to the next phase.

11. The method of claim 10 further comprising:
making each input available to start a new CRC calculation at a start of a phase following a phase during which CRC calculation for the input was complete.

12. The method of claim 1 wherein the parallel table look-up is performed with a PowerPC Altivec vperm instruction.

13. A computer readable medium having processor executable instructions thereon for implementation by a vector processor, the instructions executing a method comprising:
initializing a control vector with content from each of a plurality of inputs;

a) performing a parallel table look-up using the control vector to produce a table look-up output vector containing an element for each of the plurality of inputs by looking up table entries for CRC calculation in parallel;

b) merging each element of the control vector with new bits from each of the inputs to produce a combined cumulative results and current input vector;

c) combining with a vector XOR operation the table look-up output vector and the combined cumulative results and current input vector and storing a result as a new value for the control vector;

repeating a), b) and c) until a CRC calculation is complete for all inputs.

14. The computer readable medium of claim 13 wherein the method further comprises:
storing the table entries in at least one register and storing the control vector in a register such that the parallel table look-up operation proceeds with register inputs.

15. The computer readable medium of claim 13 wherein the method further comprises:
storing the table entries in a first and second register, the first register containing low bits for each table entry and the second register containing high bits for each table entry;
for each element of the control vector, performing the table look-up by looking up a value in each of the first and second registers and combining these to produce a table look-up output vector.

16. The computer readable medium of claim 13 wherein the method further comprises:
repeating the steps of table look-up and XOR a plurality of times each time the control vector is updated.

17. The computer readable medium of claim 13 wherein the method further comprises:
for each input that has a start that is not aligned in memory with a start of an earliest input, processing zeros for the input such that the parallel CRC calculation can start at the same time for all inputs.

18. The computer readable medium of claim 13 wherein the method further comprises:
for each input that has an end that is not aligned in memory with an end of a latest input, storing a finished CRC output upon completion of processing of the actual input, and then continuing to perform the algorithm in parallel for all inputs until all CRC calculations are complete, but ignoring the output produced after CRC completion for a given input.

19. The computer readable medium of claim 13 wherein the method further comprises:
repeating steps a), b) and c) in phases for each input, each phase comprising a set of repetitions of steps a) b) and c) for each input;
at the end of each phase, if CRC calculation for a given input is complete, storing a finished result for that input and otherwise using a result at the end of the phase as a starting point to the next phase;
making each input available to start a new CRC calculation at a start of a phase following a phase during which CRC calculation for the input was complete.

20. A device for performing a CRC calculation comprising:
a plurality of inputs;
a control register for storing a control vector;
a computer memory for storing look-up table entries;
at least one register for storing results of calculations when performing the CRC calculation;
a processor configured to:
initialize the control vector with content from each of the plurality of inputs;
a) perform a parallel table look-up using the control vector to produce a table look-up output vector containing an element for each of the plural of inputs by looking up table entries for CRC calculation in parallel;
b) merge each element of the control vector with new bits from each of the inputs to produce a combined cumulative results and current input vector;
c) combine with a vector XOR operation the table look-up output vector and the combined cumulative results and current input vector and storing a result as a new value for the control vector;
repeating a), b) and c) until the CRC calculation is complete for all inputs.

21. The device of claim 20, wherein the processor is further configured to:
perform a plurality of vector permutation operations in sequence, each vector permutation taking content from a respective one of the inputs into a high position in the vector permutation output, and shifting previously stored values in the vector permutation output.

22. The device of claim 20, wherein the processor is further configured to:
for each input that has a start that is not aligned in memory with a start of an earliest input, process zeros for the input such that the parallel CRC calculation can start at the same time for all inputs.

23. The device of claim 20, wherein the processor is further configured to:
for each input that has an end that is not aligned in memory with an end of a latest input, store a finished CRC output upon completion of processing of the actual input, and then continuing to perform the algorithm in parallel for all inputs until all CRC calculations are complete, but ignoring the output produced after CRC completion for a given input.

24. The device of claim 20, wherein the device performs a 16-way parallel CRC16 calculation such that
i) the control vector is a 16 element HiByte vector and a 16-element LoByte vector each having 8 bits per element; and
ii) the table data comprises two tables each containing 16 8-bit values;
and wherein the processor is further configured to;
perform a first pair of table lookups using the two tables with four bits of each element of HiByte as input;
remove used four bits and shifting next four bits into lookup position to produce a first combined cumulative results and current input vector;
combine with a first XOR operation outputs of the first pair of table lookups with the first combined cumulative results and current input vector;
perform a second pair of table lookups using four bits of output of first XOR operation;
remove used four bits and shifting next four bits into lookup position to produce a second combined cumulative results and current input vector;
combine with a second XOR operation outputs of the second pair of table lookups with the second combined cumulative results and current input vector;
obtain next set of 8 bits from each input and combining with an output of the second XOR operation to produce the control vector for a subsequent iteration.

25. The device of claim 20, wherein the processor is further configured to:
repeat steps a), b) and c) in phases for each input, each phase comprising a set of repetitions of steps a) b) and c) for each input;
at the end of each phase, if CRC calculation for a given input is complete, store a finished result for that input and otherwise using a result at the end of the phase as a starting point to the next phase.

26. A method of using a parallel processor for performing a CRC calculation for each of a plurality of inputs comprising:
initializing a control vector with content from each of the plurality of inputs;
a) performing a parallel operation to produce an output vector containing an element for each of the plurality of inputs;
b) merging each element of the control vector with new bits from each of the inputs to produce a combined cumulative results and current input vector;
c) combining with a vector XOR operation the output vector and the combined cumulative results and current input vector and storing a result as a new value for the control vector;
repeating a), b) and c) until a CRC calculation is complete for all inputs.

27. The method of claim 26 wherein the parallel operation is performed using parallel combinatorial logic.

* * * * *

UNITED STATES PATENT AND TRADEMARK OFFICE
CERTIFICATE OF CORRECTION

PATENT NO. : 7,363,574 B1
APPLICATION NO. : 10/961111
DATED : April 22, 2008
INVENTOR(S) : Roger Maitland et al.

It is certified that error appears in the above-identified patent and that said Letters Patent is hereby corrected as shown below:

Column 11, claim 9, line 50 "...method or claim..." should be --...method of claim...--;
Column 13, claim 20, line 36 "...plural..." should be --...plurality...--;
Column 14, claim 24, line 13 "...configured to;..." should be --...configured to:...--.

Signed and Sealed this

Second Day of September, 2008

JON W. DUDAS
*Director of the United States Patent and Trademark Office*